(12) United States Patent
Yabe et al.

(10) Patent No.: US 11,573,914 B2
(45) Date of Patent: Feb. 7, 2023

(54) NONCONSECUTIVE MAPPING SCHEME FOR DATA PATH CIRCUITRY IN A STORAGE DEVICE

(71) Applicant: SANDISK TECHNOLOGIES LLC, Addison, TX (US)

(72) Inventors: Hiroki Yabe, Yokohama (JP); Masahito Takehara, Yokohama (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 146 days.

(21) Appl. No.: 17/206,864

(22) Filed: Mar. 19, 2021

(65) Prior Publication Data
US 2022/0300162 A1    Sep. 22, 2022

(51) Int. Cl.
*G11C 7/10* (2006.01)
*G06F 13/16* (2006.01)

(52) U.S. Cl.
CPC ............ *G06F 13/16* (2013.01); *G11C 7/1039* (2013.01); *G06F 2213/16* (2013.01)

(58) Field of Classification Search
CPC ... G06F 13/16; G06F 2213/16; G11C 7/1039; Y02D 10/00
USPC ........................................ 365/185.03, 185.24
See application file for complete search history.

(56) References Cited

U.S. PATENT DOCUMENTS

| | | | | |
|---|---|---|---|---|
| 7,512,103 B1* | 3/2009 | Snodgrass | ............ | H04B 1/0483 370/337 |
| 7,958,433 B1* | 6/2011 | Yoon | .................. | H03M 13/356 711/173 |
| 8,977,827 B1* | 3/2015 | Sims | ................... | G06F 11/1451 711/113 |
| 9,449,720 B1* | 9/2016 | Lung | ................. | G11C 16/3404 |
| 2004/0042331 A1* | 3/2004 | Ikehashi | .............. | G11C 29/006 365/232 |
| 2005/0024956 A1* | 2/2005 | Tran | ................. | G11C 29/50004 365/200 |
| 2009/0248955 A1* | 10/2009 | Tamada | ............. | G06F 12/0638 711/E12.001 |
| 2009/0323446 A1* | 12/2009 | Zhang | .................. | G11C 29/026 365/201 |
| 2010/0293353 A1* | 11/2010 | Sonnier | ................. | H04L 49/109 711/170 |
| 2011/0002169 A1* | 1/2011 | Li | ........................ | G11C 29/808 365/189.05 |

(Continued)

*Primary Examiner* — Michael T Tran

(74) *Attorney, Agent, or Firm* — Morgan, Lewis & Bockius LLP

(57) ABSTRACT

A data storage system includes a storage medium including a plurality of columns of memory cells, a storage controller coupled to the storage medium, and data path circuitry including a data bus coupled to the storage controller, the data bus configured to receive a plurality of bytes of data to be written to the plurality of columns of memory cells; a block of data latches having a pitch equal to a first number of bit lines of the plurality of columns of memory cells; and column redundancy circuitry configured to pass the plurality of bytes of data to the block of data latches via the plurality of columns in accordance with a nonconsecutive mapping scheme. The nonconsecutive mapping scheme includes mapping each group of three bytes to two columns by splitting one byte of each group of three bytes into two nibbles.

20 Claims, 9 Drawing Sheets

(56) References Cited

U.S. PATENT DOCUMENTS

| | | | |
|---|---|---|---|
| 2013/0019044 A1* | 1/2013 | Kaiwa | G06F 13/4059 |
| | | | 710/307 |
| 2013/0262740 A1* | 10/2013 | Kim | G11C 29/24 |
| | | | 711/102 |
| 2013/0314992 A1* | 11/2013 | Takagiwa | G11C 16/0483 |
| | | | 365/185.09 |
| 2014/0123139 A1* | 5/2014 | Fine | G06F 21/53 |
| | | | 718/1 |
| 2014/0208062 A1* | 7/2014 | Cohen | G06F 3/0688 |
| | | | 711/206 |
| 2016/0062666 A1* | 3/2016 | Samuels | G06F 3/0616 |
| | | | 711/103 |
| 2016/0179404 A1* | 6/2016 | Nanduri | G06F 3/0688 |
| | | | 711/103 |
| 2016/0306552 A1* | 10/2016 | Liu | G06F 3/0643 |
| 2016/0307645 A1* | 10/2016 | Kim | G11C 29/76 |
| 2018/0314595 A1* | 11/2018 | Eichmeyer | G06F 11/1048 |
| 2018/0341547 A1* | 11/2018 | Bolkhovitin | G06F 3/064 |
| 2022/0019653 A1* | 1/2022 | Singla | G06F 21/79 |

* cited by examiner

NONCONSECUTIVE MAPPING SCHEME FOR DATA PATH CIRCUITRY IN A STORAGE DEVICE

TECHNICAL FIELD

The present disclosure relates to data-path architecture and column redundancy logic in data storage systems.

BACKGROUND

Non-volatile memories, such as flash memory devices, have supported the increased portability of consumer electronics, and have been utilized in relatively low power enterprise storage systems suitable for cloud computing and mass storage. The ever-present demand for almost continual advancement in these areas is often accompanied by demand to improve data storage capacity. The demand for greater storage capacity, in turn, stokes demand for greater performance (e.g., quicker reads and writes), so that the addition of storage capacity does not slow down the memory device. As such, there is ongoing pressure to increase the capacity and the efficiency of non-volatile memories in order to further improve the useful attributes of such devices. As memory arrays continue to increase in capacity, there is ongoing pressure to avoid increases in the amount of chip surface area required to implement them.

SUMMARY

This application describes various systems and methods for supporting increasingly growing memory array size requirements while optimizing the space required to implement them. Various implementations of systems and methods within the scope of the appended claims each have several aspects, no single one of which is solely responsible for the desirable attributes described herein. Without limiting the scope of the appended claims, some prominent features are described. After considering this discussion, and particularly after reading the section entitled "Detailed Description," one will understand how the features of various implementations are used to improve write performance.

BRIEF DESCRIPTION OF THE DRAWINGS

So that the present disclosure can be understood in greater detail, a more particular description may be had by reference to the features of various implementations, some of which are illustrated in the appended drawings. The appended drawings, however, merely illustrate the more pertinent features of the present disclosure and are therefore not to be considered limiting, for the description may admit to other effective features.

FIGS. 5A and 5B depict two cases in which 8-bit data is mapped to 12-bit columns in CRD circuitry in a consecutive manner.

Figure 1:
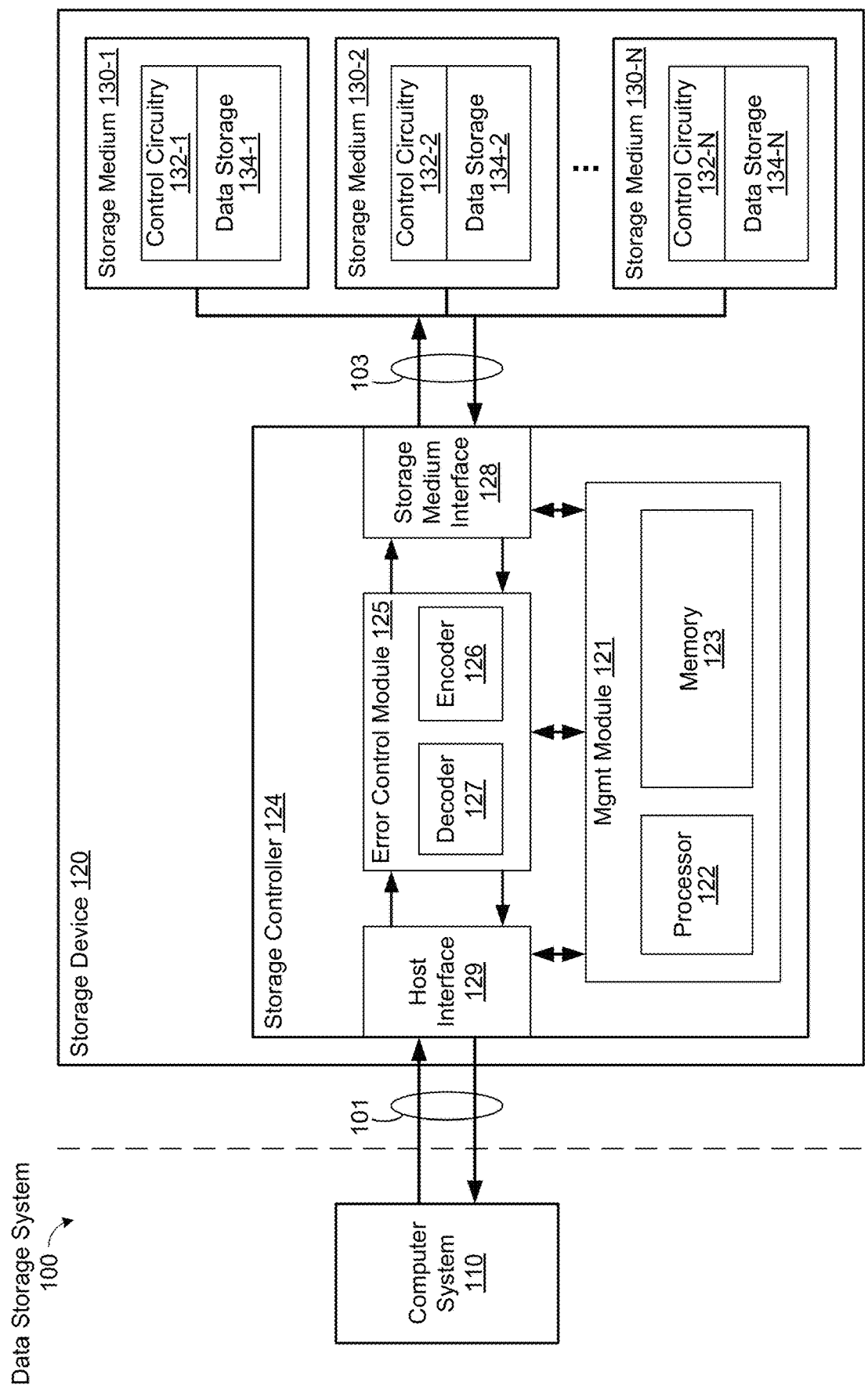
FIG. 1 is a block diagram of a data storage system in accordance with some implementations.

In accordance with common practice, the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals are used to denote like features throughout the specification and figures.

DETAILED DESCRIPTION

FIG. 1 is a diagram of an implementation of a data storage environment, namely data storage system 100. While certain specific features are illustrated, those skilled in the art will appreciate from the present disclosure that various other features have not been illustrated for the sake of brevity, and so as not to obscure more pertinent aspects of the example implementations disclosed herein. To that end, as a non-limiting example, the data storage system 100 includes a data processing system (alternatively referred to herein as a computer system or host) 110, and a storage device 120.

The computer system 110 is coupled to the storage device 120 through data connections 101. In various implementations, the computer system 110 includes the storage device 120 as a component. Generally, the computer system 110 includes any suitable computer device, such as a computer, a laptop computer, a tablet device, a netbook, an internet kiosk, a personal digital assistant, a mobile phone, a smartphone, a gaming device, a computer server, a peripheral component interconnect (PCI), a serial AT attachment (SATA), or any other computing device. In some implementations, the computer system 110 includes one or more processors, one or more types of memory, a display, and/or other user interface components such as a keyboard, a touch screen display, a mouse, a trackpad, a digital camera, and/or any number of supplemental devices to add functionality.

The storage device 120 includes one or more storage mediums 130 (e.g., N storage mediums 130, where N is an integer greater than or equal to 1). The storage medium(s) 130 are coupled to a storage controller 124 through data connections of a channel 103. In various implementations, the storage controller 124 and storage medium(s) 130 are included in the same device (e.g., storage device 120) as constituent components thereof, while in other embodiments, the storage controller 124 and storage medium(s) 130 are, or are in, separate devices. In some embodiments, the storage controller 124 is an application-specific integrated circuit (ASIC). The storage medium(s) 130 are optionally referred to as the NAND.

Each storage medium 130 includes control circuitry 132 and data storage 134. The data storage 134 may comprise any number (i.e., one or more) of memory devices including, without limitation, non-volatile semiconductor memory devices, such as flash memory (also referred to as memory cells). Flash memory devices can be configured for enterprise storage suitable for applications such as cloud computing, and/or configured for relatively smaller-scale applications such as personal flash drives or hard-disk replacements for personal, laptop and tablet computers.

In some implementations, the storage controller 124 includes a management module 121, an error control module 125, a storage medium interface 128, and a host interface 129. In some implementations, the storage controller 124 includes various additional features that have not been illustrated for the sake of brevity, so as not to obscure more pertinent features of the example implementations disclosed herein. As such, a different arrangement of features may be possible.

The host interface 129 couples the storage device 120 and its storage controller 124 to one or more computer systems 110. The host interface 129 typically includes data buffers (not shown) to buffer data being received and transmitted by the storage device 120 via the data connections 101.

The storage medium interface 128 couples the storage controller 124 to the storage medium(s) 130. The storage medium interface 128 provides an interface to the storage medium(s) 130 though the data connections of the channel 103. In some implementations, the storage medium interface 128 includes read and write circuitry.

The error control module 125 is coupled between the storage medium interface 128 and the host interface 129. In some implementations, the error control module 125 is provided to limit the number of uncorrectable errors inadvertently introduced into data. To that end, the error control module 125 includes an encoder 126 and a decoder 127. The encoder 126 encodes data to produce a code word, which is subsequently stored in a storage medium 130. When the encoded data is read from the storage medium 130, the decoder 127 applies a decoding process to recover the data and correct errors within the error correcting capability of the error control code. Various error control codes have different error detection and correction capacities, and particular codes are selected for various applications.

The management module 121 typically includes one or more processors 122 (sometimes referred to herein as CPUs, processing units, hardware processors, processors, microprocessors or microcontrollers) for executing modules, programs and/or instructions stored in memory and thereby performing processing operations. However, in some implementations, the processor(s) 122 are shared by one or more components within, and in some cases, beyond the function of the storage controller 124. The management module 121 is coupled by communication buses to the host interface 129, the error control module 125, and the storage medium interface 128 in order to coordinate the operation of these components.

The management module 121 also includes memory 123 (sometimes referred to herein as controller memory), and one or more communication buses for interconnecting the memory 123 with the processor(s) 122. Communication buses optionally include circuitry (sometimes called a chipset) that interconnects and controls communications between system components. The controller memory 123 includes high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. The controller memory 123 optionally includes one or more storage devices remotely located from the one or more processors 122. In some embodiments, the controller memory 123, or alternatively the non-volatile memory device(s) within the controller memory 123, comprises a non-transitory computer readable storage medium. In some embodiments, the controller memory 123, or the non-transitory computer readable storage medium of the controller memory 123, stores the programs, modules, and/or data structures, or a subset or superset thereof, for performing one or more of the operations described in this application with regard to any of the components associated with the storage controller 124.

In some embodiments, the various operations described in this application correspond to sets of instructions for performing the corresponding functions. These sets of instructions (i.e., modules or programs) need not be implemented as separate software programs, procedures or modules, and thus various subsets of these modules may be combined or otherwise rearranged in various embodiments. In some embodiments, the memory 123 may store a subset of modules and data structures. Furthermore, the memory 123 may store additional modules and data structures. In some embodiments, the programs, modules, and data structures stored in the memory 123, or the non-transitory computer readable storage medium of the memory 123, provide instructions for implementing any of the methods described below. Stated another way, the programs or modules stored in the memory 123, when executed by the one or more processors 122, cause the storage device 120 to perform any of the operations described below. Although FIG. 1 shows various modules, FIG. 1 is intended more as a functional description of the various features, which may be present in the modules than as a structural schematic of the embodiments described herein. In practice, the programs, modules, and data structures shown separately could be combined, and some programs, modules, and data structures could be separated.

Figure 2:
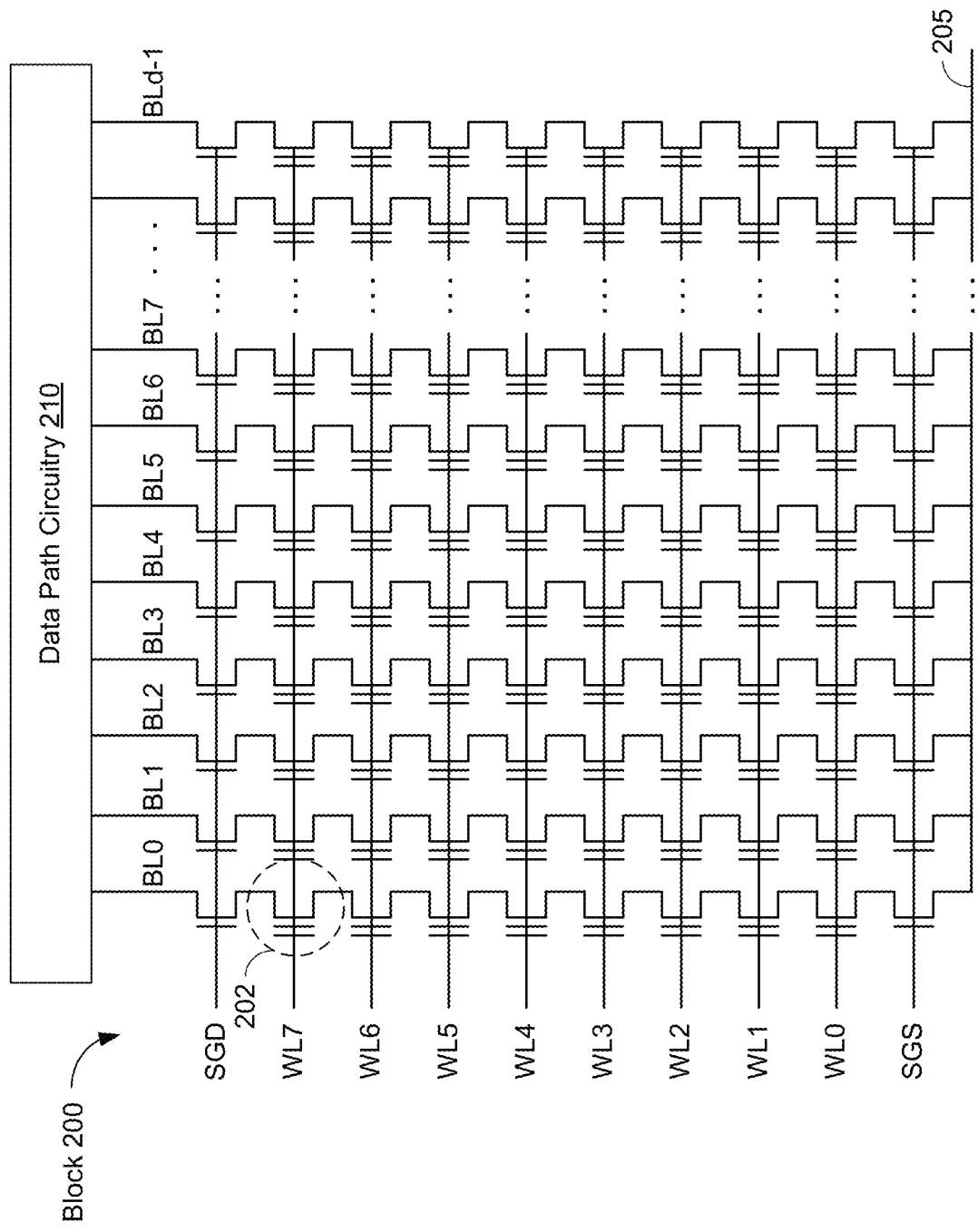
FIG. 2 is a block diagram of an array of memory cells and a charge pump in accordance with some implementations.

FIG. 2 depicts a block 200 of memory cells (e.g., 202) in a data storage 134 of a storage medium 130 (FIG. 1). The memory cells communicate with respective word lines WL0-WL7, respective bit lines BL0-Bd−1, and a common source line 205. In the example provided, eight memory cells are connected in series to form a NAND string, and there are eight data word lines WL0 through WL7. One terminal of each NAND string is connected to a corresponding bit line via a drain select gate (connected to select gate drain line SGD), and another terminal is connected to a common source 205 via a source select gate (connected to select gate source line SGS). Thus, the common source 205 is coupled to each NAND string. The block 200 may be one of many such blocks in a memory array of data storage 134 (FIG. 1).

In erase operations, a high voltage (e.g., 20 V) may be applied to a substrate on which the NAND string is formed to remove charge from the memory cells. In programming operations, a voltage (e.g., in the range of 12-21 V) may be applied to a selected word line. In one approach, step-wise increasing program pulses are applied until a memory cell is verified to have reached an intended state. Moreover, pass voltages at a lower level may be applied concurrently to the unselected word lines.

In read operations, the select gates (SGD and SGS) may be connected to a voltage (e.g., in the range of 2.5 to 4.5 V) and the unselected word lines may be raised to a read pass voltage (e.g., in the range of 4.5 to 6 V) to make the transistors operate as pass gates. The selected word line is connected to a voltage, a level of which is specified for each read and verify operation, to determine whether a threshold voltage of the concerned memory cell is above or below such level. For example, WL7 is turned on by connecting it to a read voltage, and the stored value (logic 0 or 1) from cell 202 is transmitted via BL0 to read circuitry in data path circuitry 210.

Each bit line is coupled to data path circuitry 210, which includes read circuitry configured to sense voltages on each bit line in accordance with read operations. The read circuitry includes sense amplifiers that sense the low power signals from respective bitlines (e.g., BL0) that represents data bits (1 or 0) stored in respective memory cells (e.g., 202). The sense amplifiers amplify small voltage swings to recognizable logic levels so the data can be interpreted properly by logic outside the memory array (e.g., storage controller 124). After a sense amplifier for a particular bit line amplifies the sensed voltage to a normal logic level, the bit from the desired cell is then latched from the cell's sense amplifier into a buffer, and put on the output bus (e.g., 103).

Figure 3C:
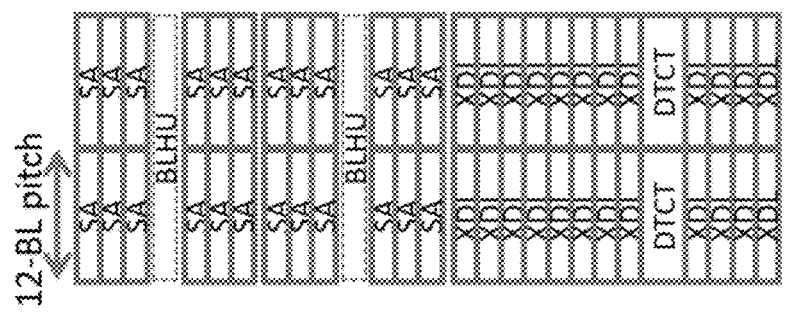
FIGS. 3A-3C depict arrangements of sense amplifiers and data latches in the data path circuitry of FIG. 2 in accordance with some implementations.
Figure 3B:
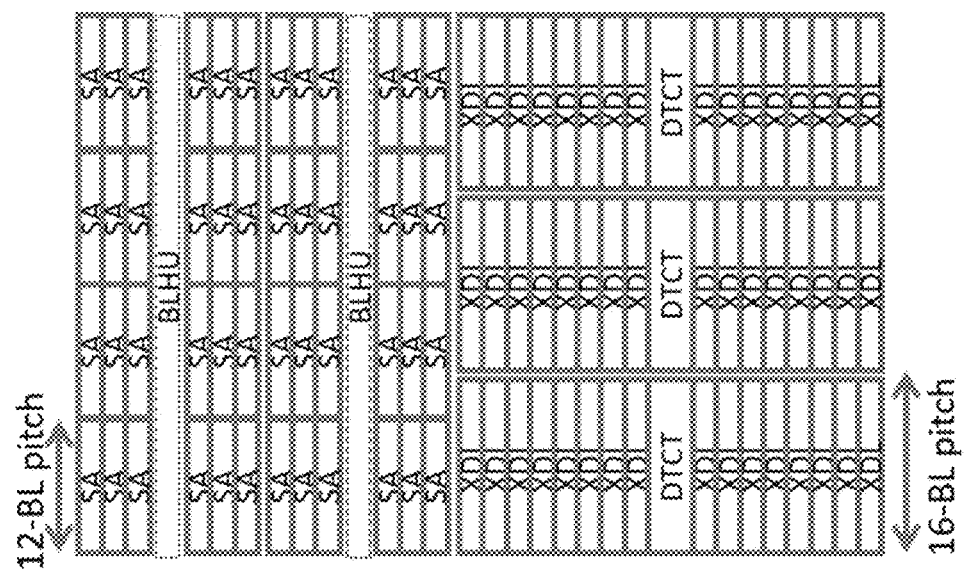
Figure 3A:
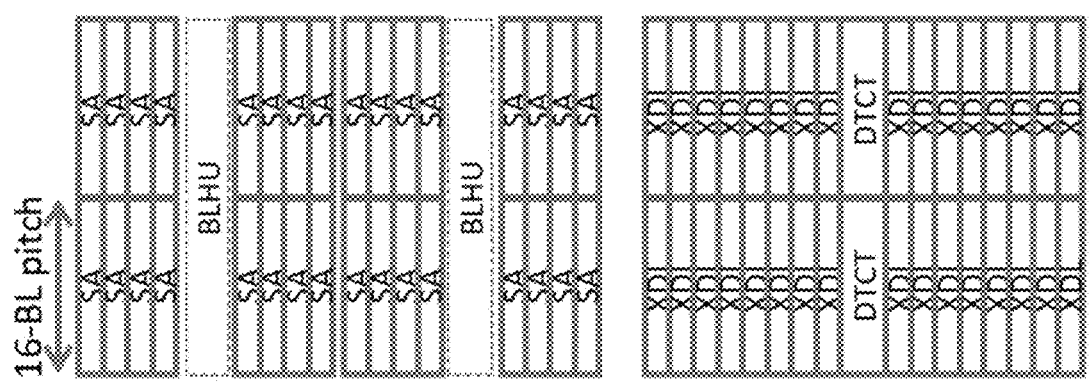

FIGS. 3A-3C depict different arrangements of sense amplifiers (SA) and data latches (XDL) in the data path circuitry 210 in accordance with some implementations. In each arrangement, there is (i) a block of sense amplifiers SA with bit line connection circuits BLHU (hookup areas) disposed throughout, and (ii) a block of data latches XDL with verification pass/fail detection circuits DTCT disposed throughout.

In FIG. 3A, the distance between the centers of neighboring sense amplifiers is the equivalent of 16 bit lines (e.g., BL0-BL16, FIG. 2). This is referred to as a 16-BL (bit line) pitch. Likewise, neighboring data latches have a 16-BL pitch. Since 16 is a multiple of 8, a byte of data can pass through the data path circuitry 210 in a straightforward manner. However, since sense amplifiers require a lot of surface area on the chip, it may be advantageous to shrink them to a 12-BL pitch (or less).

In FIG. 3B, the sense amplifiers have a 12-BL pitch, thereby saving space on the chip. However, the data latches still have a 16-BL pitch, due to the straightforward alignment with 8-bit units of data. This difference in pitch requires additional control circuitry, which increases the complexity of the data path circuitry 210 and may cause additional read errors.

In FIG. 3C, the sense amplifiers and the data latches have the same 12-BL pitch, thereby saving space on the chip and maintaining alignment between sense amplifier and data latch transistors. However, if data is still to be read in units of 8 bits, the data must be mapped to units of 12-bits in order to accommodate the 12-BL pitch of the data latches. This 12-bit to 8-bit mapping (described in more detail below) minimizes the control overhead in the data path circuitry 210 as well as inside the data latch structure.

Figure 4:
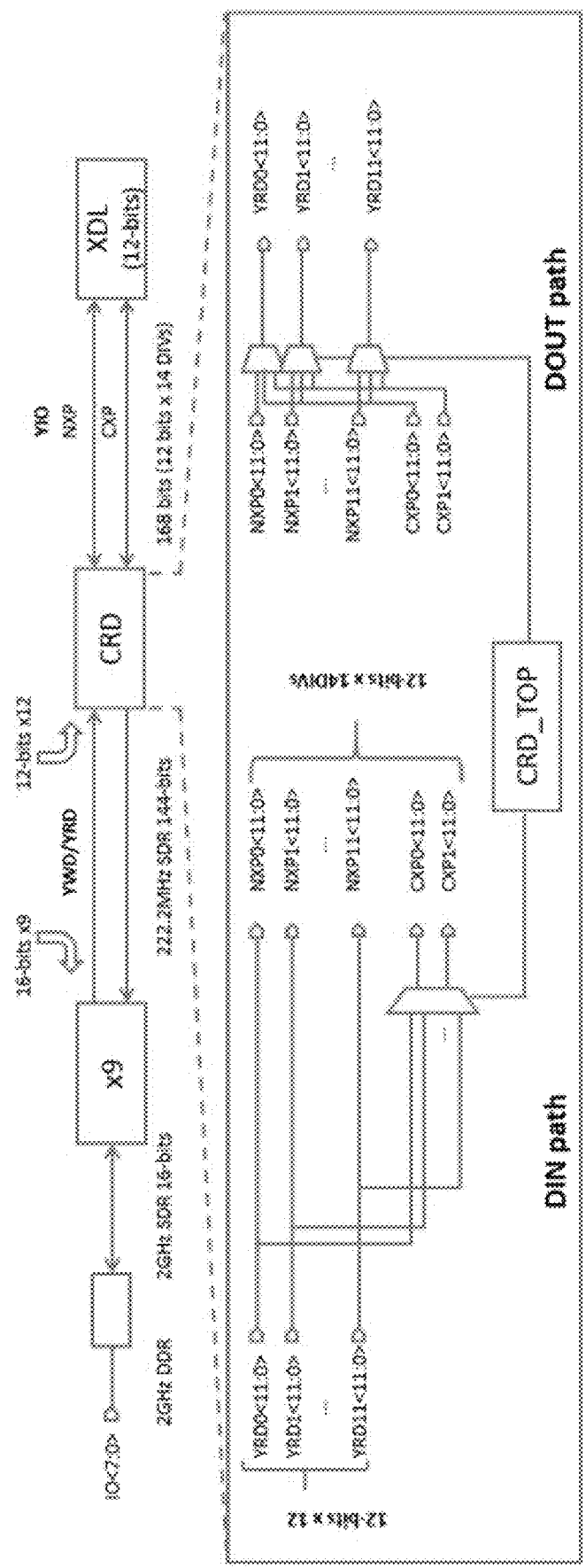
FIG. 4 is a block diagram of data path circuitry for the 12-BL pitch arrangement in FIG. 3C in accordance with some implementations.

FIG. 4 depicts a block diagram of data path circuitry 210 for the 12-BL pitch arrangement in FIG. 3C in accordance with some implementations. Data path circuitry 210 includes an 8-bit data bus IO<7:0> (referred to as an IO bus) at interface 128 of the storage controller 124 (see FIG. 1). The IO bus transmits and receives data via serializer/deserializer circuitry x9, write/read buses YWD/YRD, column redundancy circuitry CRD, data bus YIO (including columns NXP and redundant columns CXP), and data latches XDL, all of which may be implemented in a storage medium 130 (see FIG. 1).

Column redundancy circuitry CRD provides redundant columns CXP to replace those having bad memory cells. More specifically, as memory arrays continue to increase in size, the denser memory structures may become more susceptible to memory defects (such as a column short, bad interconnect, etc.). Therefore, to maintain a high production yield, it becomes increasingly desirable to provide redundancy in a memory array, for example, by including extra columns that can be used to replace defective columns. In the absence of such redundancy, a single bad memory cell can render an entire memory array unusable. Memory arrays may incorporate such redundant columns by addressing the appropriate redundant column instead of the defective column.

In the column redundancy circuitry CRD, 12 units of 12 bits of data to be read YRD0<11:0> through YRD11<11:0> are provided to the CRD. Each unit of 12 bits of data corresponds to a column of bit lines (e.g., BL0, FIG. 2). If error sensing circuitry (not shown) determines that one or more memory cells in up to two of the bit line strings is bad and cannot be used, up to two spare columns CXP0<11:0> and CXP1<11:0> may replace the column(s) with the bad memory cell(s). Control circuitry in the CRD (CRD_TOP) replaces the bad columns with the spare columns by multiplexing the spare column(s) CXP to replace the appropriate column(s) NXP. Stated another way, if there are no bad columns, data is transferred between NXP and YRD. However, if one of the sense amplifiers connected to a particular NXP is bad, that column may be replaced with a CXP column.

The serializer/deserializer x9 is arranged to process 9 units of 16-bit data (16×9), and the column redundancy circuitry CRD is arranged to process 12 units of 12-bit data (12×12). As such, the write/read YWD/YRD bus is a 144-bit write path (right arrow) or read path (left arrow), since 144 is a multiple of both 16 and 12. To accommodate this data transfer, clock speeds may be slowed by a factor of 9 (e.g., a 2 GHz clock would be slowed to 222.2 MHz as a result of serializing/deserializing the data).

Since data in this arrangement is arranged in 8-bit units (IO<7:0>) but columns in the CRD circuitry are arranged in 12-bit units (NXP<11:0>), there may be a mismatch between valid and invalid bits when a bad column NXP is replaced with a spare column CXP. FIGS. 5A and 5B depict two cases in which 8-bit data to be read or written (BYTE0 through BYTE8) is mapped to 12-bit columns in CRD circuitry (NXP0 through NXP5) in a consecutive manner.

In FIG. 5A, there are only four bytes of data to be written. As such, BYTE0 through BYTE3 are valid, but the fifth byte (BYTE4) and onward are invalid. Only the first 8 bits of NXP2 should be written, and the current values in the data latches for the last 4 bits should not be rewritten. As a result, the CRD replaces NXP2 with CXP. In this case, only the lower 8 bits of CXP (the bits corresponding to valid BYTE3) are valid.

In FIG. 5B, there are only two bytes of data to be written. As such, BYTE0 and BYTE1 are valid, but the third byte (BYTE2) and onward are invalid. Only the first 4 bits of NXP1 should be written, and the current values in the data latches for the last 8 bits should not be rewritten. As a result, the CRD replaces NXP1 with CXP. In this case, only the lower 4 bits of CXP (the bits corresponding to valid BYTE1) are valid.

For such a consecutive mapping scheme, a replacement column CXP may include 12 valid bits, 8 valid lower bits+4 invalid upper bits (FIG. 5A), 4 valid lower bits+8 invalid upper bits (FIG. 5B), or 12 invalid bits. In order to manage these scenarios in a way that does not increase the error rate, the XDL structure would require the lower 4 bits, middle 4 bits, and upper 4 bits of each CXP column to be independently controlled. Such a scheme may require a much more complicated XDL architecture.

Figure 6:
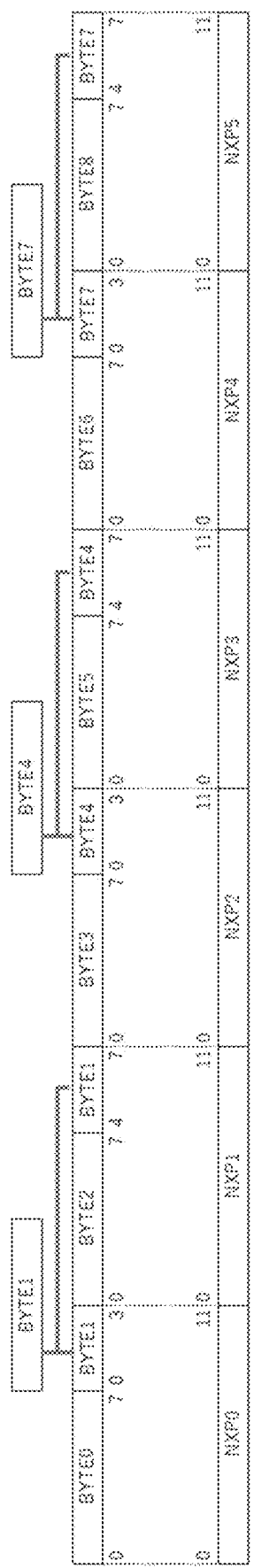
FIG. 6 depicts a mapping scheme in which the 8-bit data is mapped to 12-bit columns in CRD circuitry in a nonconsecutive manner.
Figure 7:
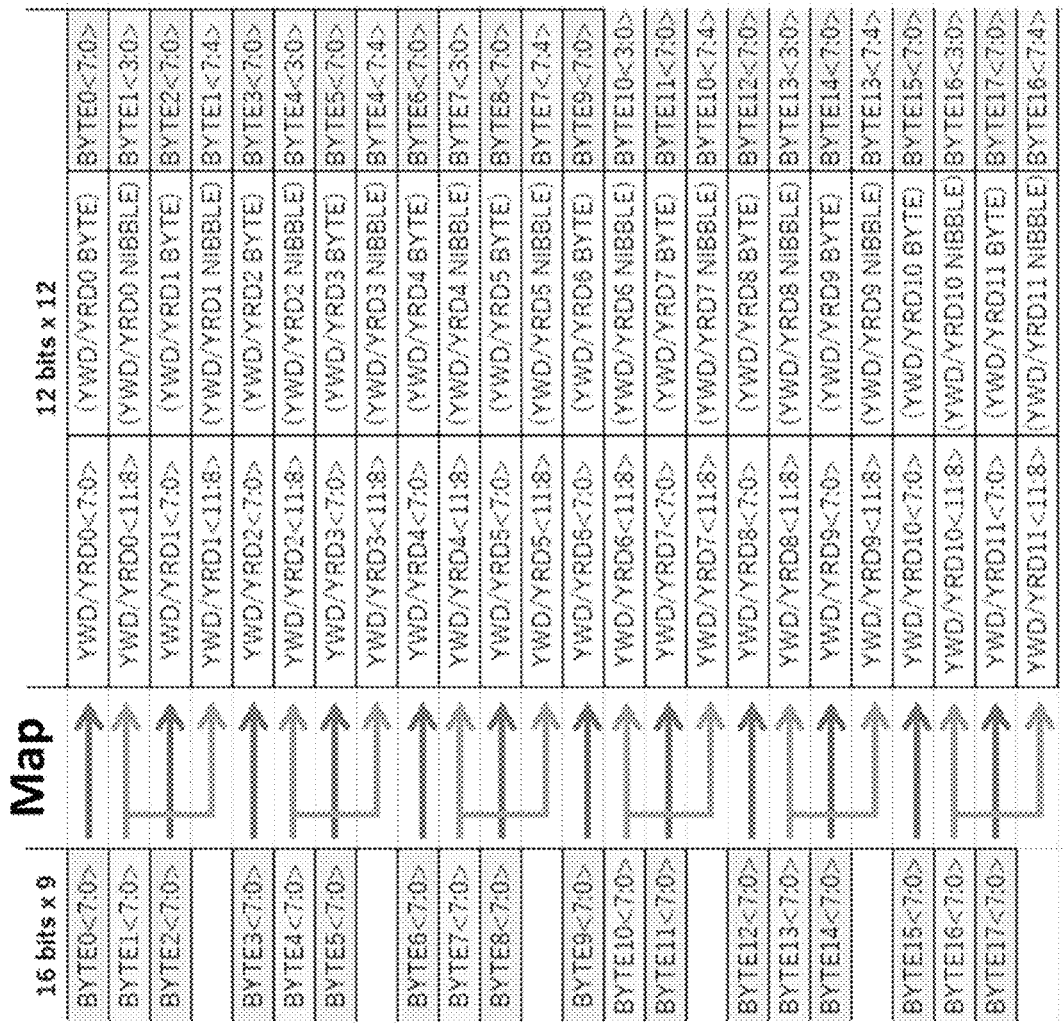
FIG. 7 is a detailed table of the nonconsecutive mapping scheme of FIG. 6 in accordance with some implementations.

FIG. 6 depicts a mapping scheme in which the XDL data (BYTEs) are mapped to the CRD columns (NXP) in a nonconsecutive manner. In this nonconsecutive mapping scheme, one out of every three bytes of data is split into two 4-bit groups referred to herein as nibbles (a first nibble including the lower 4 bits of the byte and a second nibble including the upper 4 bits of the byte), and each group of three bytes is mapped to two CRD columns NXP (or CXP in the event a column is replaced). FIG. 7 depicts a detailed table of such a mapping scheme in accordance with some implementations.

To implement this mapping, each 12-bit YWD/YRD bus may be split into a lower 8-bit byte and an upper 4-bit nibble (or in an alternative implementation, each 12-bit bus may be split into a lower 4-bit nibble and an upper 8-bit byte). For example, out of 18 bytes (16×9 bits), bytes 0, 2, 3, 5, 6, 8, 9, 11, 12, 14, 15, and 17 may go to BYTEs of the 12-bit YWD/YRD bus, while bytes 1, 4, 7, 10, 13, and 16 may be broken up to two 4-bit nibbles, and go to NIBBLEs of the 12-bit YWD/YRD bus. This is one example in which one out of every three bytes may be broken into two nibbles and spread throughout neighboring bytes. Other examples (e.g., byte 2 split into two nibbles between, before, or after bytes 0 and 1) may be implemented without departing from the mapping concepts described herein.

As a result of the mapping scheme depicted in FIGS. 6 and 7, the lower 8-bit BYTE <7:0> and upper 4-bit NIBBLE <11:8> always have consistent boundaries, thereby allowing for more streamlined control circuitry (an example of which is described in detail below with reference to FIGS. 8 and 9). Stated another way, for however many bytes of user input, the NXP column is either all valid, all invalid, 8 lower bits valid+4 upper bits invalid, or 8 lower bits invalid+4 upper bits valid. In each scenario, the lower byte of each NXP column is either all valid or all invalid, and the upper nibble of each NXP column is either all valid or all invalid. As a result, the XDL structure only requires the lower 8 bits and upper 4 bits of each CXP column to be independently controlled, thereby allowing for more streamlined control circuitry.

Figure 8:
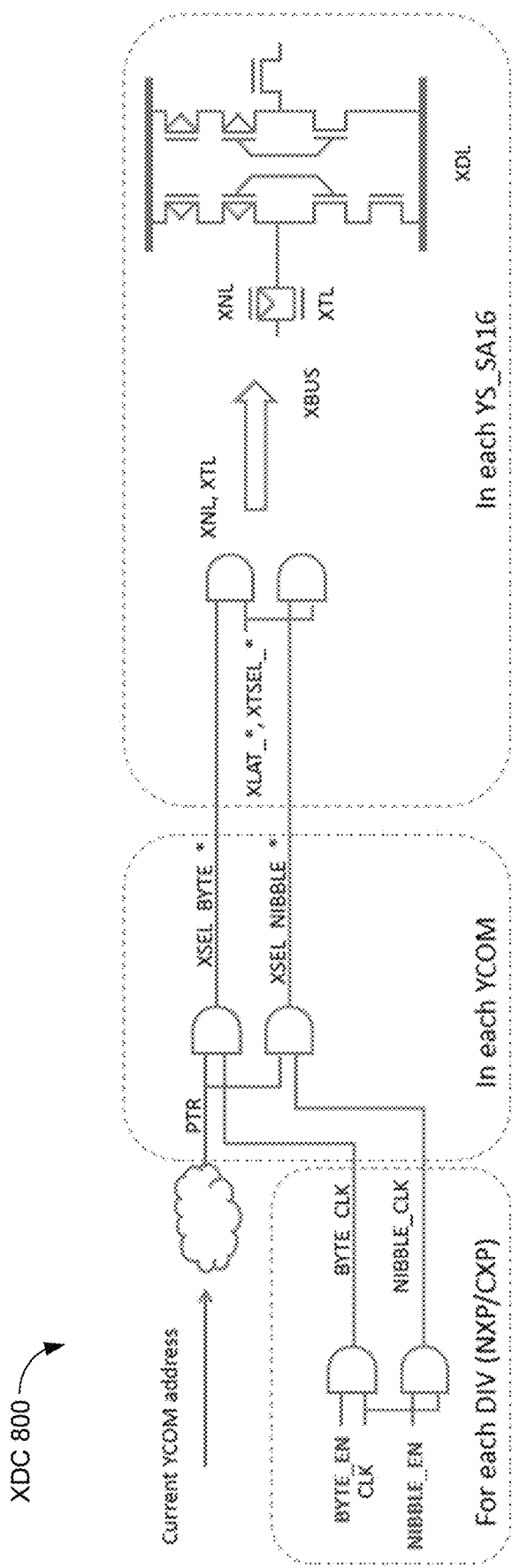
FIG. 8 is a diagram of control circuitry for handling byte and nibble bits for each column in accordance with some implementations.

FIG. 8 depicts control circuitry (XDC) 800 for handling the BYTE and NIBBLE bits for each NXP/CXP column. Control circuitry 800 includes two control paths to allow for separate BYTE and NIBBLE control. For each column, there are two enable signals (BYTE_EN and NIBBLE_EN) for enabling writing to the lower 8-bit byte and the upper 4-bit nibble, respectively. These two enable signals separately indicate whether the lower 8-bit byte and/or the upper 4-bit nibble of the column are valid. Each path controls the XNL and XTL controls, switching them so that if data is invalid, the data in the XDL data latch will be prevented from being overwritten.

Figure 9:
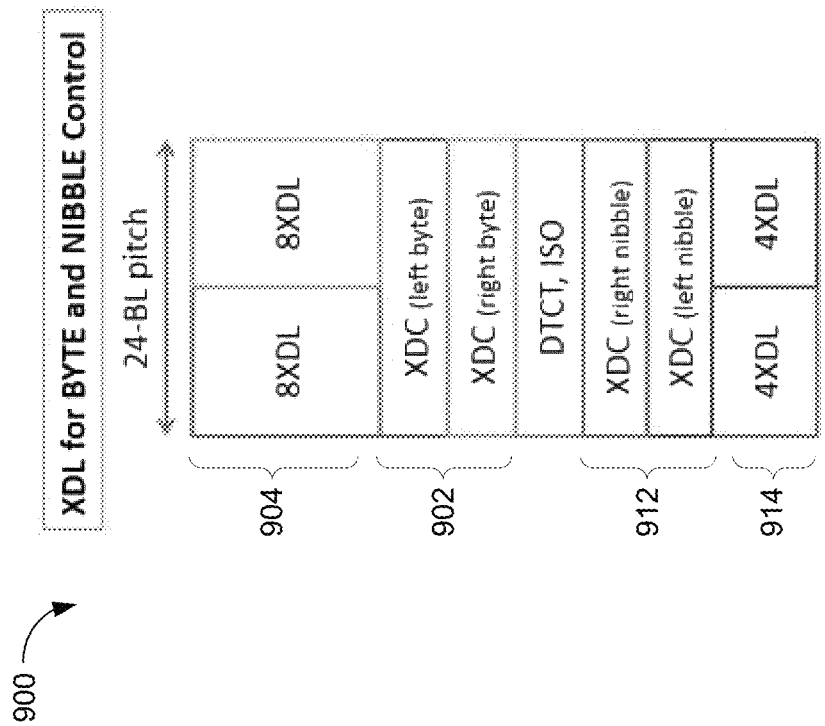
FIG. 9 depicts a layout for byte and nibble control circuitry for a block of data latches in accordance with some implementations.

FIG. 9 depicts a layout for BYTE and NIBBLE control circuitry XDC for a block of data latches XDL. The block of data latches XDL corresponds to that in FIG. 3C, with 8 rows of two sets of side-by-side data latches XDL, verification pass/fail detection circuits DTCT, and 4 rows of two sets of side-by-side data latches XDL. To support the independent BYTE and NIBBLE control as described above, left/right byte control circuitry 902 controls data transfer from left/right byte data latches 904, and left/right nibble control circuitry 912 controls data transfer from left/right nibble data latches 914. For example, if BYTE_EN (FIG. 8) is high (corresponding to XDC 902, FIG. 9), the corresponding byte data latches 904 are enabled, and if NIBBLE_EN (FIG. 8) is high (corresponding to XDC 912, FIG. 9), the corresponding nibble data latches 914 are enabled. Otherwise, the data latches 904/914 are disabled, thereby preventing data in those latches from being overwritten.

The 12-tier XDL implementations described above with reference to FIGS. 3C, 4, and 6-9 have several benefits, including decreased surface area requirements due to smaller CRD circuitry, and reduced CMOS development cost because only 12-BL pitch transistors are necessary. In addition, the CRD structure described above features 8-bit to 12-bit mapping that minimizes the control overhead in the data path circuitry, as well as inside the data latches XDL. The data latch XDL structure with dual control circuitry XDC allows for separate control of BYTE and NIBBLE within the 12-bit bus as well as separate enable control for BYTE and NIBBLE.

The foregoing description has been described with reference to specific implementations. However, the illustrative discussions above are not intended to be exhaustive or to limit the claims to the precise forms disclosed. Many variations are possible in view of the above teachings. The implementations were chosen and described to best explain principles of operation and practical applications, to thereby enable others skilled in the art.

The various drawings illustrate a number of elements in a particular order. However, elements that are not order dependent may be reordered and other elements may be combined or separated. While some reordering or other groupings are specifically mentioned, others will be obvious to those of ordinary skill in the art, so the ordering and groupings presented herein are not an exhaustive list of alternatives.

As used herein: the singular forms "a", "an," and "the" include the plural forms as well, unless the context clearly indicates otherwise; the term "and/or" encompasses all possible combinations of one or more of the associated listed items; the terms "first," "second," etc. are only used to distinguish one element from another and do not limit the elements themselves; the term "if" may be construed to mean "when," "upon," "in response to," or "in accordance with," depending on the context; and the terms "include," "including," "comprise," and "comprising" specify particular features or operations but do not preclude additional features or operations.

What is claimed is:

1. A data storage system, comprising:
   a storage medium including a plurality of columns of memory cells;
   a storage controller coupled to the storage medium; and
   data path circuitry of the storage medium, the data path circuitry including:
   a data bus configured to receive, from the storage controller, a plurality of bytes of data to be written to the plurality of columns of memory cells;
   a block of data latches having a pitch equal to a first number of bit lines of the plurality of columns of memory cells;
   column redundancy circuitry configured to pass the plurality of bytes of data to the block of data latches via the plurality of columns in accordance with a nonconsecutive mapping scheme;
   wherein the nonconsecutive mapping scheme includes mapping each group of N bytes to M columns, where N>M.

2. The data storage system of claim 1, wherein N equals 3, M equals 2, and the nonconsecutive mapping scheme includes, for two or more groups of three bytes, each group including a first byte, a second byte, and a third byte:
   mapping (i) the first byte and (ii) a first four-bit nibble of the second byte to a first column of the plurality columns; and mapping (i) the third byte and (ii) a second four-bit nibble of the second byte to a second column of the plurality of columns.

3. The data storage system of claim 2, wherein the nonconsecutive mapping scheme includes:
mapping the first byte to the lower 8 bits of the first column;
mapping the third byte to the lower 8 bits of the second column;
mapping the first four-bit nibble of the second byte to the upper 4 bits of the first column; and
mapping the second four-bit nibble of the second byte to the upper 4 bits of the second column.

4. The data storage system of claim 2, wherein the data path circuitry further includes:
first control circuitry configured selectively enable or disable the first and third bytes of the first and second columns; and
second control circuitry, independent of the first control circuitry, and configured to selectively enable or disable the first and second nibbles of the first and second columns.

5. The data storage system of claim 4, wherein:
the first control circuitry includes a switch that prevents data from being written to a respective data latch when a respective first or third byte is disabled; and
the second control circuitry includes a switch that prevents data from being written to a respective data latch when a respective first or second nibble is disabled.

6. The data storage system of claim 1, further comprising a plurality of sense amplifiers having a pitch equal to the first number of bit lines of the plurality of columns of memory cells.

7. The data storage system of claim 6, wherein:
the first number of bit lines is equal to 12;
the data bus is configured to receive units of 16 bits; and
the column redundancy circuitry is configured to receive units of 12 bits.

8. The data storage system of claim 1, further comprising a serializer/deserializer configured to decrease a bus speed of the data bus and provide the plurality of bytes of data to the column redundancy circuitry.

9. A method of writing data in a data storage system comprising a storage medium including a plurality of columns of memory cells, a storage controller coupled to the storage medium, and data path circuitry of the storage medium, the method comprising:
receiving via a data bus of the data path circuitry, from the storage controller, a plurality of bytes of data to be written to the plurality of columns of memory cells;
passing via column redundancy circuitry of the data path circuitry the plurality of bytes of data to a block of data latches via the plurality of columns in accordance with a nonconsecutive mapping scheme;
wherein the block of data latches has a pitch equal to a first number of bit lines of the plurality of columns of memory cells; and
wherein the nonconsecutive mapping scheme includes mapping each group of N bytes to M columns, where N>M.

10. The method of claim 9, wherein N equals 3, M equals 2, and the nonconsecutive mapping scheme includes, for two or more groups of three bytes, each group including a first byte, a second byte, and a third byte:
mapping (i) the first byte and (ii) a first four-bit nibble of the second byte to a first column of the plurality columns; and
mapping (i) the third byte and (ii) a second four-bit nibble of the second byte to a second column of the plurality of columns.

11. The method of claim 10, wherein the nonconsecutive mapping scheme includes:
mapping the first byte to the lower 8 bits of the first column;
mapping the third byte to the lower 8 bits of the second column;
mapping the first four-bit nibble of the second byte to the upper 4 bits of the first column; and
mapping the second four-bit nibble of the second byte to the upper 4 bits of the second column.

12. The method of claim 10, further comprising:
selectively enabling or disabling, via first control circuitry of the data path circuitry, the first and third bytes of the first and second columns; and
selectively enabling or disabling, via second control circuitry of the data path circuitry, the first and second nibbles of the first and second columns.

13. The method of claim 12, wherein:
selectively enabling or disabling the first and third bytes includes allowing data to be written to, or preventing data from being written to, a respective data latch; and
selectively enabling or disabling the first and second nibbles includes allowing data to be written to, or preventing data from being written to, a respective data latch.

14. The method of claim 9, wherein:
the first number of bit lines is equal to 12;
the data bus is configured to receive units of 16 bits; and
the column redundancy circuitry is configured to receive units of 12 bits.

15. A data storage system comprising a storage medium including a plurality of columns of memory cells, a storage controller coupled to the storage medium, and data path circuitry of the storage medium, the data path circuitry comprising:
means for receiving via a data bus of the data path circuitry, from the storage controller, a plurality of bytes of data to be written to the plurality of columns of memory cells;
means for passing via column redundancy circuitry of the data path circuitry the plurality of bytes of data to a block of data latches via the plurality of columns in accordance with a nonconsecutive mapping scheme;
wherein the block of data latches has a pitch equal to a first number of bit lines of the plurality of columns of memory cells; and
wherein the nonconsecutive mapping scheme includes mapping each group of N bytes to M columns, where N>M.

16. The data storage system of claim 15, wherein N equals 3, M equals 2, and the nonconsecutive mapping scheme includes, for two or more groups of three bytes, each group including a first byte, a second byte, and a third byte:
mapping (i) the first byte and (ii) a first four-bit nibble of the second byte to a first column of the plurality columns; and
mapping (i) the third byte and (ii) a second four-bit nibble of the second byte to a second column of the plurality of columns.

17. The data storage system of claim 16, wherein the nonconsecutive mapping scheme includes:
mapping the first byte to the lower 8 bits of the first column;

mapping the third byte to the lower 8 bits of the second column;

mapping the first four-bit nibble of the second byte to the upper 4 bits of the first column; and mapping the second four-bit nibble of the second byte to the upper 4 bits of the second column.

18. The data storage system of claim 16, further comprising:

means for selectively enabling or disabling, via first control circuitry of the data path circuitry, the first and third bytes of the first and second columns; and means for selectively enabling or disabling, via second control circuitry of the data path circuitry, the first and second nibbles of the first and second columns.

19. The data storage system of claim 18, wherein:

selectively enabling or disabling the first and third bytes includes allowing data to be written to, or preventing data from being written to, a respective data latch; and selectively enabling or disabling the first and second nibbles includes allowing data to be written to, or preventing data from being written to, a respective data latch.

20. The data storage system of claim 15, wherein:

the first number of bit lines is equal to 12;

the data bus is configured to receive units of 16 bits; and the column redundancy circuitry is configured to receive units of 12 bits.

\* \* \* \* \*